United States Patent
Inoue et al.

(10) Patent No.: US 6,933,181 B2
(45) Date of Patent: Aug. 23, 2005

(54) METHOD FOR FABRICATING SEMICONDUCTOR DEVICE

(75) Inventors: Kaoru Inoue, Shiga (JP); Yoshito Ikeda, Osaka (JP); Katsunori Nishii, Osaka (JP); Yutaka Hirose, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 101 days.

(21) Appl. No.: 10/620,430

(22) Filed: Jul. 17, 2003

(65) Prior Publication Data

US 2004/0137761 A1 Jul. 15, 2004

(30) Foreign Application Priority Data

Jul. 17, 2002 (JP) ........................................ 2002-208389

(51) Int. Cl.[7] .............................................. H01L 21/00
(52) U.S. Cl. ........................ 438/149; 438/197; 438/604; 438/285; 438/590; 438/172; 257/183; 257/192; 257/183.1; 257/194; 148/DIG. 113
(58) Field of Search ................................. 438/796, 149, 438/483, 172, 167, 570, 235, 197, 604, 285, 590; 257/103, 280, 183, 192, 194, 183.1; 148/DIG. 113

(56) References Cited

U.S. PATENT DOCUMENTS 5,192,987 A * 3/1993 Khan et al. ............... 257/183.1
5,296,395 A * 3/1994 Khan et al. ................. 438/149
6,548,333 B2 * 4/2003 Smith ......................... 438/172

OTHER PUBLICATIONS

Masato et al., Novel High Drain Breakdown Voltgage AlGaN/GaN HFETs using selective Thermal Oxidation Process, IEEE IEDM 00–377, 2000.*
Sullivan et al., High–Power 10 GHz operation of AlGaN HFETS on insulating SiC, IEEE Elect. Device Letters, vol. 19, No. 6, 1998.*
C.F. Lin et al., Improved Contact Performance of GaN Film Using Si Diffusion:, 2000 American Institute of Physics, Applied Physics Letters, Vo. 76, No. 14, pp. 1878–1880, Apr. 3, 2000.
Hiroyuki Masato et al., "Novel High Drain Breakdown Voltage AlGaN/GaN HFETs Using Selective Thermal Oxidation Process", IEEE, IEDM 16.2.1–16.2.4, pp. 377–380, 2000.

* cited by examiner

Primary Examiner—Matthew Smith
Assistant Examiner—Belur Keshavan
(74) Attorney, Agent, or Firm—McDermott Will & Emery LLP

(57) ABSTRACT

In a method for fabricating a semiconductor device, a first semiconductor layer of aluminum gallium nitride is first formed on a substrate, and a protection film containing silicon is then formed on the first semiconductor layer in such a manner that a device-isolation region is uncovered. Thereafter, the method further includes the step of heat-treating the first semiconductor layer in an oxidizing atmosphere whose temperature is adjusted to be within a range of 950° C. or more and 1050° C. or less.

7 Claims, 4 Drawing Sheets

METHOD FOR FABRICATING SEMICONDUCTOR DEVICE

BACKGROUND OF THE INVENTION

The present invention relates to a semiconductor device fabrication method using Group III–V nitride semiconductors, and more particularly relates to a semiconductor device fabrication method in which an isolating insulator film which isolates semiconductor elements from each other is formed by a selective oxidation technique.

The Group III–V nitride semiconductors, which have material characteristics such as high breakdown electric field strength, high thermal conductivity, and high electron saturation velocity, are promising materials for high-frequency power devices. Examples of the Group III–V nitride semiconductors currently used include gallium nitride (GaN), aluminum gallium nitride (AlGaN), indium gallium nitride (InGaN) and indium aluminum gallium nitride (InAlGaN). Particularly, in a semiconductor device in which an AlGaN/GaN heterojunction structure is used, electrons accumulate in the vicinity of the heterojunction interface to form a so-called two-dimensional electron gas layer, thereby achieving a high electron mobility.

A conventional heterojunction field effect transistor (HFET) in which an AlGaN/GaN heterojunction is used includes an undoped GaN layer and an AlGaN layer formed on the GaN layer and doped with a donor impurity. Formed on the AlGaN layer are a gate electrode, a source electrode and a drain electrode. By adopting the AlGaN/GaN heterojunction, the conventional HFET achieves an electron velocity more than two times higher than that of a HFET which uses a heterojunction of aluminum gallium arsenide (AlGaAs) and indium gallium arsenide (InGaAs), in a high electric field of about $1\times10^5$ V/cm. In addition, a two-dimensional electron gas layer, formed in the GaN layer near the interface with the AlGaN layer, is spaced apart from the donor impurity in the AlGaN layer, which enables a decrease in source resistance components as well as allowing the high electron mobility. Furthermore, in the field effect transistor structured in this manner, the distance between the gate electrode and the two-dimensional electron gas layer may be designed to be about several tens nm, such that the short channel effect is suppressed even when the gate length is shortened, thereby resulting in good saturation characteristics while achieving a downsizing of the HFET.

In fabricating the conventional HEFT with this structure, a method which is called a selective oxidation method may be used to form an isolating insulator film which isolates transistor elements from each other. In the selective oxidation method, an oxidation protection film is selectively formed on the device structure of the stacked Group III–V nitride semiconductors so that the oxidation protection film covers the active region, and thereafter a heat treatment is performed in an oxidizing atmosphere to oxidize part of the device structure which is exposed through the oxidation protection film. In this manner, an isolating insulator film is formed out of the oxides of the Group III–V nitride semiconductors. After removing the oxidation protection film, the gate electrode, the drain electrode and the source electrode are formed in the active region of the device structure, thereby obtaining the finished conventional HFET.

In the conventional HFET fabrication method, a technique in which silicon is used as material for the oxidation protection film has been known.

In the conventional HFET fabrication method, also known is a technique in which, with silicon used as material for the oxidation protection film, a heat treatment is performed in an oxidizing atmosphere whose temperature is 900° C. or higher, thereby diffusing the silicon from the oxidation protection film into the GaN layer. Use of this technique allows the impurity concentration of the GaN layer to increase, which reduces the contact resistance of the source and drain electrodes.

However, in the known HFET fabrication method, if the selective oxidation process is performed in the oxygen atmosphere at a temperature of about 900° C., the oxidation treatment needs to be carried out for more than 4 hours in order to form an isolating insulator film having a sufficient thickness for device isolation. Moreover, the oxidation treatment may have to be performed for more than 12 hours depending on the components of the semiconductor multilayer structure. Specifically, in the process step of forming the isolating insulator film, if the contact resistance is decreased by diffusing the silicon, the work efficiency of the isolating-insulator-film formation process step decreases, which leads to an increase in the HFET product cost.

Further, if the temperature of the oxygen atmosphere is increased in order to reduce the oxidation treatment time, the amount of silicon which diffuses from the oxidation protection film increases, such that the silicon diffusion extends from the surface of the device structure into the inside thereof, thereby converting the structure into an n-type semiconductor layer. As a consequence, the electric characteristics of the device structure of the Group III–V nitride semiconductors are destroyed. This destruction produces problems such as an increase in the gate current leakage and a decrease in the electron mobility of the two-dimensional electron gas layer.

SUMMARY OF THE INVENTION

It is therefore an object of the present invention to solve the above-mentioned conventional problems so that in a semiconductor device of Group III–V nitride semiconductors, an isolating insulator film is formed in a short period of time, while at the same time silicon is diffused without degrading electric characteristics in the isolating-insulator-film formation step.

To achieve the object, an inventive method for fabricating a semiconductor device includes: the step of forming on a first semiconductor layer of aluminum gallium nitride a protection film having an opening and containing silicon, and the step of heat-treating the first semiconductor layer in an oxidizing atmosphere whose temperature is adjusted to be within a range of 950° C. or more and 1050° C. or less.

According to the inventive semiconductor device fabrication method, silicon diffusion from the protection film is prevented from extending below the first semiconductor layer, which allows an isolating insulator film to be formed through the heat treatment in a short time without degrading electric characteristics of the semiconductor device. Further, setting the heat treatment temperature within the range of 950° C. or more and 1050° C. or less ensures that silicon diffuses into the surface of the first semiconductor layer, thereby enabling a decrease in the contact resistance of the semiconductor device.

In the inventive semiconductor device fabrication method, the heat-treatment step preferably further includes the step of oxidizing part of the first semiconductor layer which is located under the opening of the protection film, and the step of diffusing the silicon downwardly from the protection film.

The inventive semiconductor device fabrication method preferably further includes the step of forming on the first semiconductor layer a second semiconductor layer which is mainly made of gallium nitride, before the protection-film formation step is performed.

Then, the silicon diffused from the protection film due to the heat treatment goes through the second semiconductor layer and then stops in the first semiconductor layer. In this manner, the use of the second semiconductor layer as a cap layer allows an improvement in the electric characteristics of the semiconductor device.

In the inventive semiconductor device fabrication method, the protection-film formation step preferably further includes the step of forming on the first semiconductor layer a silicon-supplying layer which contains silicon, and the step of forming an oxidation protection layer on the silicon-supplying layer.

This permits silicon to be selectively diffused from the silicon-supplying layer into the first semiconductor layer by the heat treatment, while allowing an isolating insulator film to be selectively formed with the oxidation protection layer used as a mask.

In the inventive semiconductor device fabrication method, in the silicon-supplying-layer formation step, the silicon-supplying layer is preferably formed on a part of an active region of the first semiconductor layer other than a part of the active region on which a gate will be formed, and in the oxidation-protection-layer formation step, the oxidation protection layer is preferably formed over the active region of the first semiconductor layer so as to cover the silicon-supplying layer.

Then, silicon is diffused selectively into the part of the active region other than its gate-formation region, thereby enabling the gate electrode to have a larger Schottky barrier.

In the inventive semiconductor device fabrication method, the oxidation protection layer is preferably made of silicon oxide or silicon nitride.

In the inventive semiconductor device fabrication method, the oxidation protection layer is preferably a multilayer film in which a silicon oxide film, and a silicon film or a silicon nitride film are stacked in this order.

DESCRIPTION OF THE PREFERRED EMBODIMENTS

Hereinafter, selective oxidation methods used in semiconductor device fabrication methods in accordance with the present invention will be described with reference to the accompanying drawings.

Figure 1A:
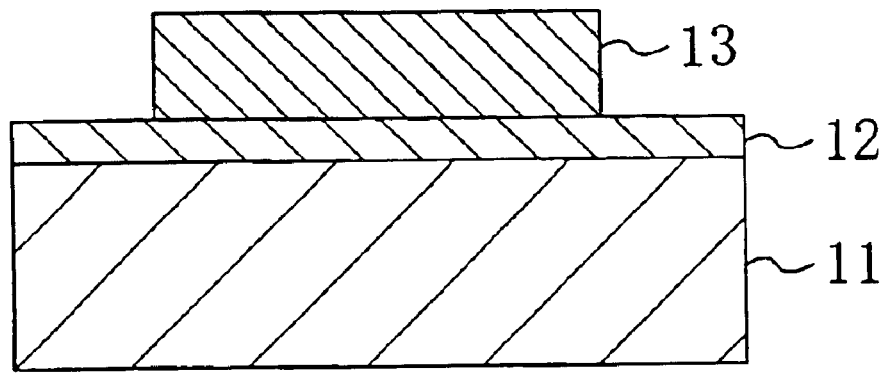
FIGS. 1(a) and 1(b) illustrate an exemplary selective oxidation method used in semiconductor device fabrication methods in accordance with the present invention.
Figure 1B:
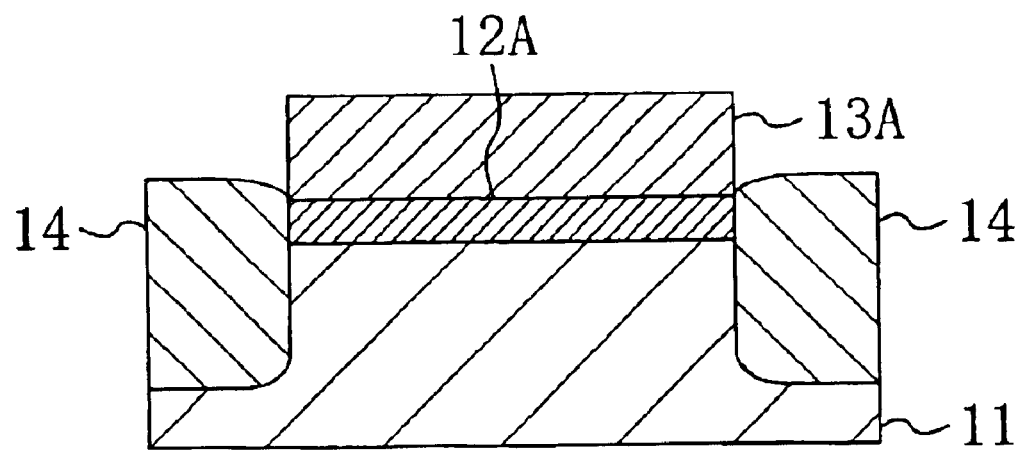

FIGS. 1(a) and 1(b) are cross-sectional views illustrating process steps in an exemplary selective oxidation method used in semiconductor device fabrication methods in accordance with the present invention.

First, as shown in FIG. 1(a), a GaN layer 11 with a thickness of about 3 μm and an AlGaN layer 12 with a thickness of about 28 nm are grown on a substrate (not shown) by a metalorganic vapor phase epitaxy (MOVPE) process or a molecular beam epitaxy (MBE) process, thereby forming a semiconductor multilayer structure composed of the Group III–V nitride semiconductors. Subsequently, an oxidation protection film 13 of silicon is selectively formed on the AlGaN layer 12. The AlN composition of the AlGaN layer 12 is about 0.25.

Next, as shown in FIG. 1(b), the semiconductor multilayer structure with the oxidation protection film 13 formed thereon is introduced in an oxidizing atmosphere such as an oxygen gas, and the temperature of the oxidizing atmosphere is adjusted to be about 1000° C. to perform a heat treatment for about two hours. As a result, the oxidizing atmosphere causes the oxidation protection film 13 to oxidize from its surface side and turn into a silicon oxide film 13A. Part of the AlGaN layer 12 which is not covered by the oxidation protection film 13 also undergoes oxidation from its surface side in the oxidizing atmosphere, thereby forming an insulating film 14 out of the oxide of the Group III–V nitride semiconductor. The other part of the AlGaN layer 12 covered by the oxidation protection film 13 turns into a silicon-containing AlGaN layer 12A because silicon is diffused from the oxidation protection film 13 into that part.

In this method, setting the heat treatment temperature at about 1000° C. ensures that the dimension of the insulating film 14 in the depth direction has a value which is sufficient for the insulating film 14 to be used as an isolating insulator film, even when the duration of the heat treatment process is a two-hour extent.

Further, in order to evaluate electric-characteristic variation in the heterojunction resulting from the above-described selective oxidation method, the sheet resistance of the heterojunction structure of the GaN layer 11 and the silicon-containing AlGaN layer 12A was measured to determine whether the silicon had diffused below the silicon-containing AlGaN layer 12A after the heat treatment. For the measurement of the sheet resistance, after the process step shown in FIG. 1(b), the silicon oxide film 13A is removed using a mixture solution of hydrofluoric acid and nitric acid, and two ohmic electrodes are then formed spaced apart from each other on the silicon-containing AlGaN layer 12A. The sheet resistance between the ohmic electrodes can be measured by a TLM method. As a result, it was confirmed that the sheet resistance value after the heat treatment was 400 Ω/sq., which had hardly changed from a value obtained before the heat treatment.

If the heat treatment had caused the silicon in the oxidation protection film 13 to reach the GaN layer 11 through the silicon-containing AlGaN layer 12A, the diffused silicon would have caused an ionized impurity scattering in a two-dimensional electron gas layer formed in the vicinity of the heterojunction interface between the GaN layer 11 and the silicon-containing AlGaN layer 12A, which should have led to significant increases in the sheet resistance. In view of this, it can be considered that the silicon in the oxidation protection film 13 hardly diffused below the AlGaN layer 12 through the above-described heat treatment process.

It was also confirmed that the sheet resistance value did not change to such an extent as to exceed the range of experimental error even in the case of extending the heat treatment time to a 6-hour extent. In particular, taking into account the fact that the thickness of the AlGaN layer 12 is as small as about 28 nm, it is considered that the silicon of the oxidation protection film 13 hardly diffuses into part of the AlGaN layer 12 which is located near the interface with the GaN layer 11.

On the other hand, the contact resistances of the ohmic electrodes on the AlGaN layer 12 were measured after the heat treatment. As a result, it was confirmed that the contact resistance values were decreased to about a fifth of corresponding contact resistances obtained before the heat treatment. From this, it is found that the heat treatment performed at about 1000° C. caused the silicon in the oxidation protection film 13 to have diffused into the surface portion of the AlGaN layer 12, but not into its portion near the interface with the GaN layer 11.

It should be noted that the temperature of the heat treatment is not limited to about 1000° C., but may be any temperature within a range of 950° C. or more and 1050° C. or less. A heat treatment temperature smaller than 950° C. results in a decrease in the amount of silicon diffused, in which case the effect of reducing the contact resistance cannot be obtained sufficiently. On the other hand, in the case of a heat treatment temperature higher than 1050° C., the oxidation protection film 13 melts to degrade the shapes of the surface structure and insulating film 14 of the semiconductor multilayer structure.

Figure 2A:
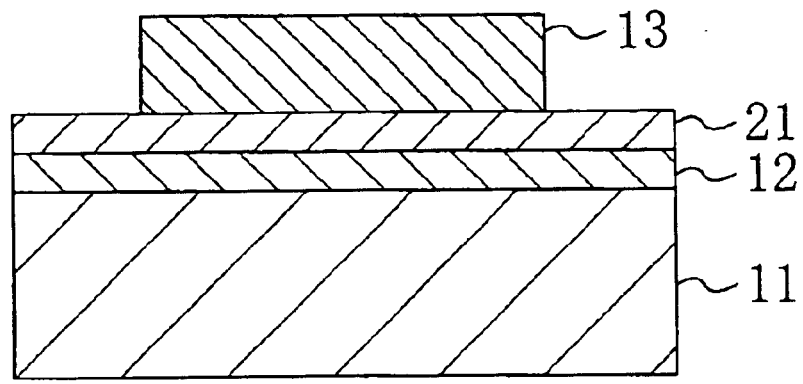
FIGS. 2(a) and 2(b) illustrate another exemplary selective oxidation method used in semiconductor device fabrication methods in accordance with the present invention.
Figure 2B:
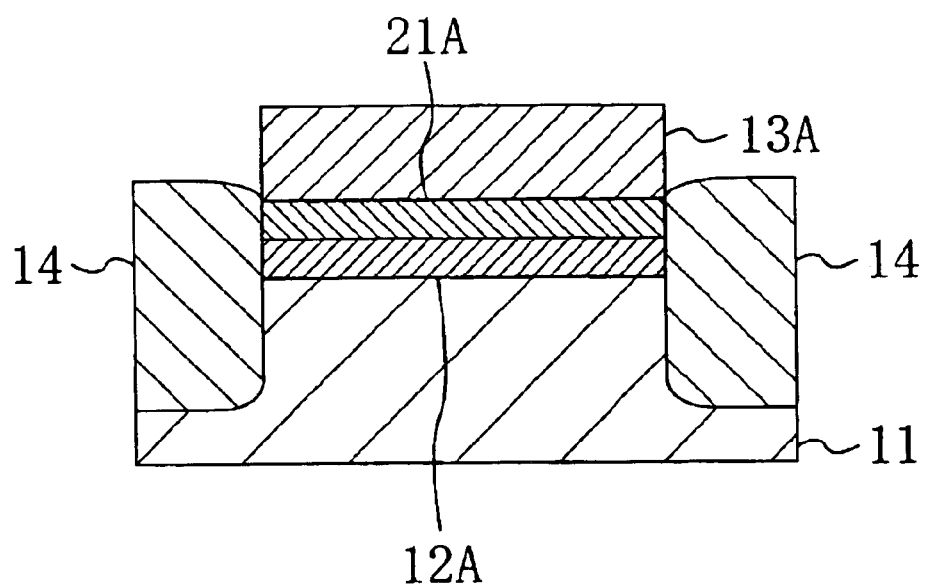

FIGS. 2(a) and 2(b) are cross-sectional views illustrating process steps in another exemplary selective oxidation method used in semiconductor device fabrication methods in accordance with the present invention.

The selective oxidation method shown in FIGS. 2(a) and 2(b) differs from the selective oxidation method of FIGS. 1(a) and 1(b) in that a cap layer 21 of GaN is formed on an AlGaN layer 12.

First, as shown in FIG. 2(a), a GaN layer 11, an AlGaN layer 12, and a cap layer 21 of GaN are grown on a substrate (not shown) by a MOVPE process or a MBE process, thereby forming a semiconductor multilayer structure of the Group III–V nitride semiconductors. Subsequently, an oxidation protection film 13 of silicon is selectively formed on the cap layer 21.

Next, as shown in FIG. 2(b), the semiconductor multilayer structure with the oxidation protection film 13 formed thereon is introduced in an oxidizing atmosphere such as an oxygen gas, and the temperature of the oxidizing atmosphere is adjusted to be about 1000° C. to perform a heat treatment for about two hours. As a result, the oxidizing atmosphere causes the oxidation protection film 13 to oxidize from its surface side and turn into a silicon oxide film 13A. Part of the cap layer 21 which is not covered by the oxidation protection film 13 also undergoes oxidation from its surface side in the oxidizing atmosphere, thereby forming an insulating film 14 out of the oxide of the Group III–V nitride semiconductor. Respective parts of the AlGaN layer 12 and cap layer 21 which are covered by the oxidation protection film 13 turn into a silicon-containing AlGaN layer 12A and a silicon-containing cap layer 21A because silicon diffuses from the oxidation protection film 13 into those parts.

According to the heat oxidation method used in the present invention, the cap layer 21 of GaN is formed on the AlGaN layer 12, and the silicon is diffused throughout the cap layer 21 in the depth direction by the heat treatment. However, the silicon diffusion stops in the upper portion of the AlGaN layer 12, thus having no effects on the electric characteristics below the AlGaN layer 12.

The material that forms the cap layer 21 is not limited to GaN. Even when another Group III–V nitride semiconductor whose main constituent is GaN is used, the AlGaN layer 12 prevents silicon diffusion.

As described above, according to the heat treatment of the present invention, the AlGaN layer 12 is provided in the upper portion of the semiconductor multilayer structure of the Group III–V nitride semiconductors, and the heat treatment is performed in the oxidizing atmosphere whose temperature is adjusted to be within a range of 950° C. or more and 1050° C. or less. This not only permits the insulating film 14 for device isolation to be formed in a short time, but also allows silicon to be diffused from the oxidation protection film 13 into the surface portion of the AlGaN layer 12, thereby achieving the desired electric characteristics.

(Embodiment 1)

Hereinafter, a semiconductor device fabrication method in accordance with a first embodiment of the present invention will be described with reference to the accompanying drawings.

Figure 3A:
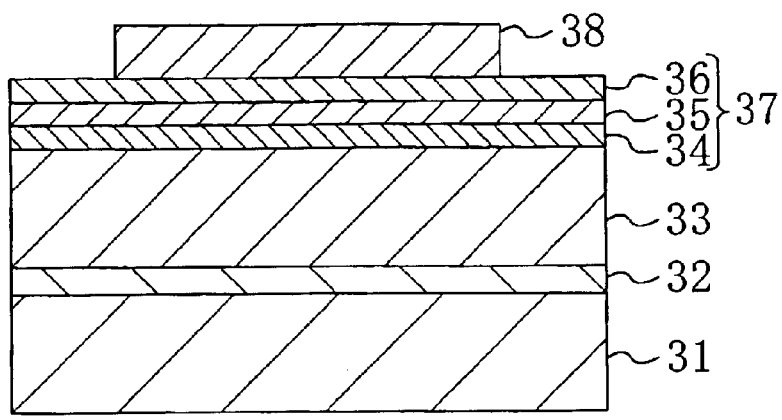
FIGS. 3(a) through 3(c) are cross-sectional views illustrating process steps of a semiconductor device fabrication method in accordance with a first embodiment of the present invention.
Figure 3B:
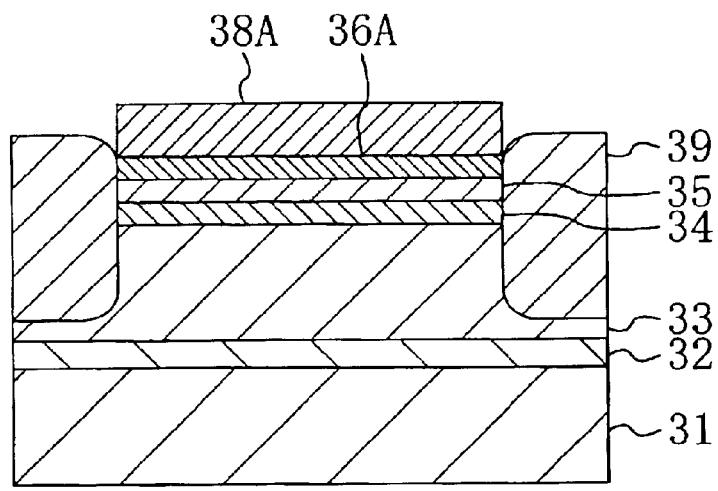
Figure 3C:
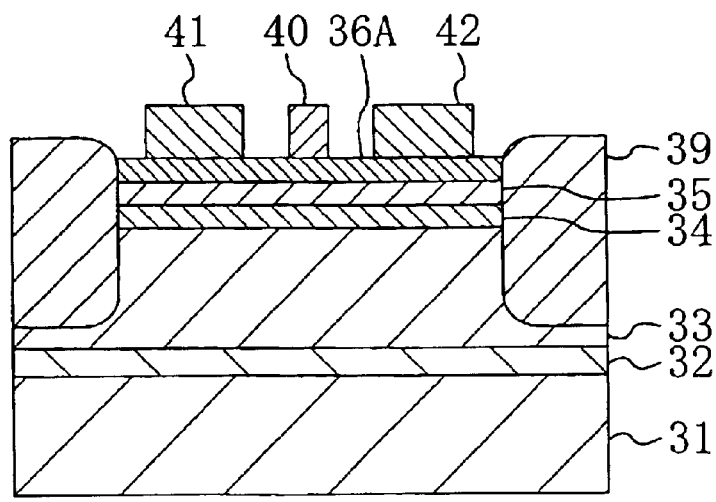

FIGS. 3(a) through 3(c) are cross-sectional views illustrating process steps of a semiconductor device fabrication method in accordance with the first embodiment of the present invention.

First, as shown in FIG. 3(a), an AlN layer 32, an undoped GaN layer 33 with a thickness of about 3 μm, a first undoped AlGaN layer 34 with a thickness of about 5 nm, an n-type AlGaN layer 35 with a thickness of about 20 nm, and a second undoped AlGaN layer 36 with a thickness of about 3 nm are epitaxially grown in this order on a substrate 31 of sapphire or silicon carbide (SiC) by a MOVPE process or a MBE process, thereby forming a semiconductor multilayer structure of the Group III–V nitride semiconductors. Subsequently, an oxidation protection film 38 of silicon with a thickness of 200 nm is selectively formed on the semiconductor multilayer structure so that the oxidation protection film 38 covers the active region and uncovers the device-isolation region. The n-type AlGaN layer 35 is doped with silicon serving as an n-type impurity at a concentration of about $4 \times 10^{18}$ cm$^{-3}$. The AlN composition of the first undoped AlGaN layer 34, n-type AlGaN layer 35 and second undoped AlGaN layer 36 (these three semiconductor layers of AlGaN will be hereinafter referred to as an AlGaN layer 37) is about 0.25.

It should be noted that the material that forms the substrate 31 does not have to be limited to sapphire or silicon carbide, but a substrate made of another material may be used.

Next, as shown in FIG. 3(b), the semiconductor multilayer structure with the oxidation protection film 38 formed thereon is introduced in an oxidizing atmosphere at a temperature of about 1000° C., and then subjected to a heat treatment for about 1 through 2 hours. As a result, the oxidation protection film 38 has its surface oxidized and turns into a silicon oxide film 38A. In this process step, part of the semiconductor multilayer structure which is not covered by the oxidation protection film 38 undergoes oxidation from its surface side to form an isolating insulator film 39 out of the oxides of the Group III–V nitride semiconductors. In the other part thereof which is covered by the oxidation protection film 38, silicon diffuses from the oxidation protection film 38 into the surface of the AlGaN layer 37. This causes the first undoped AlGaN layer 36 to turn into a silicon-containing AlGaN layer 36A in which the diffused silicon is present in the surface portion.

In this embodiment, performing the heat treatment at a temperature of about 1000° C. enables the isolating insulator film 39, having a sufficient thickness for device isolation, to be formed in a period of time which is about one-fourth to one-fifth of that of the conventional heat treatment performed at 900° C.

Next, as shown in FIG. 3(c), after the silicon oxide film 38A formed through the heat treatment process is removed using a mixture solution of hydrofluoric acid and nitric acid, a gate electrode 40 of nickel (Ni) or palladium (Pd), and source and drain electrodes 41 and 42, each composed of a multilayer film of titanium (Ti) and aluminum (Al) stacked in this order, are formed. In the process step of forming the source and drain electrodes 41 and 42, a heat treatment is performed in a hydrogen atmosphere whose temperature is set within a range of 500° C. or more and 900° C. or less, thereby forming the source and drain electrodes 41 and 42 as ohmic electrodes.

It should be noted that the material that forms the source and drain electrodes 41 and 42 is not limited to the multilayer film of titanium and aluminum, but may be a metal material which makes ohmic contact with the surface of the semiconductor multilayer structure. Also, the material that forms the gate electrode is not limited to nickel or palladium, but may be any material which allows formation of a sufficient Schottky barrier between the gate electrode and the surface of the semiconductor multilayer structure.

The semiconductor device formed in the above manner, if formed as a HFET with a gate length of 1 $\mu$m, has a maximum drain current of about 500 mA/mm through 900 mA/mm and a maximum mutual conductance value of about 200 mS/mm, thereby achieving good electric characteristics. Further, where the temperature of the heat treatment is adjusted to be about 1000° C., the contact resistance value is about $5\times10^{-6}$ $\Omega$ cm$^2$, which is about one-fifth of that of the conventional heat treatment performed at 900° C.

Moreover, in the heterojunction structure between the GaN layer 33 and the AlGaN layer 37, the sheet resistance value is 400 $\Omega$/sq., which is equivalent to a value obtained in the conventional heat treatment at 900° C. This means that the silicon diffusion from the oxidation protection film 38 due to the heat treatment at the elevated temperature has substantially no effect on the electric characteristics of the heterostructure.

In the case of a heat oxidation carried out at 950° C., the contact resistance value was reduced to about half as compared to the conventional heat treatment at 900° C. Also, a semiconductor device which is obtained when an oxidation protection film 38 has been formed, but no heat oxidation has been performed, has a contact resistance which is almost the same as that obtained when the conventional heat treatment at 900° C. is performed.

The height of the Schottky barrier of the gate electrode 40, on the other hand, tends to decrease as the heat treatment temperature increases. When the temperature was 900° C., 950° C. and 1000° C., the height of the Schottky barrier was 1 eV, 0.95 eV and 0.8 eV, respectively. This is presumably because although silicon did not diffuse from the oxidation protection film 38 significantly, the silicon was introduced into the surface portion of the AlGaN layer 38.

In this embodiment, the semiconductor multilayer structure of the Group III–V nitride semiconductors has the heterojunction structure of the GaN layer 33 and the AlGaN layer 37. However, the semiconductor multilayer structure may have a heterojunction structure of a semiconductor layer of AlGaN and a semiconductor layer of InGaN. Particularly, when a relatively thin InGaN layer with an In composition of about 5% is formed on a GaN layer, the resultant structure has good crystallinity and thus may be used for fabricating devices without causing any problem.

In the first embodiment, the uppermost layer of the semiconductor multilayer structure is not limited to the AlGaN layer 37. As in the case described using FIGS. 2(a) and 2(b), a cap layer of GaN may be formed on the AlGaN layer 37. Then, the cap layer may be used to reduce the source resistance, for example. In this case, it is also possible to suppress the silicon diffusion from the oxidation protection film 38 in the surface portion of the AlGaN layer 37, which therefore prevents the silicon diffusion from proceeding to such an extent as to degrade the electric characteristics of the semiconductor device.

(Embodiment 2)

Hereinafter, a semiconductor device fabrication method in accordance with a second embodiment of the present invention will be described with reference to the accompanying drawings.

FIGS. 4(a) through 4(d) are cross-sectional views illustrating process steps of a semiconductor device fabrication method in accordance with the second embodiment of the present invention.

Figure 4A:
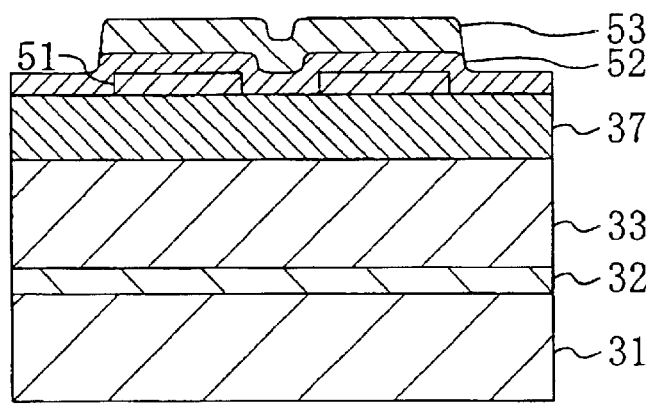
FIGS. 4(a) through 4(d) are cross-sectional views illustrating process steps of a semiconductor device fabrication method in accordance with a second embodiment of the present invention.

First, as shown in FIG. 4(a), an AlN layer 32, a GaN layer 33, and an AlGaN layer 37, which includes a first undoped AlGaN layer, an n-type AlGaN layer and a second undoped AlGaN layer, are stacked in this order on a substrate 31 in the same manner as in the second embodiment, thereby forming a semiconductor multilayer structure of the Group III–V nitride semiconductors. Subsequently, an oxidation protection film 38 of silicon with a thickness of 200 nm is selectively formed on the semiconductor multilayer structure. Then, a first silicon film 51 with a thickness of 100 nm is selectively formed on the semiconductor multilayer structure so that the first silicon film 51 covers the active region except for a part thereof on which a gate electrode will be formed. Next, a silicon compound film 52 made of silicon oxide is formed over the semiconductor multilayer structure so as to cover the first silicon film 51. Thereafter, a second silicon film 53 with a thickness of about 200 nm is selectively formed in such a manner that the second silicon film 53 covers the upper side of the active region, while uncovering the upper side of the device-isolation region.

The material that forms the silicon compound film 52 is not limited to silicon oxide, but may be any material whose silicon does not diffuse through a heat treatment process.

Figure 4B:
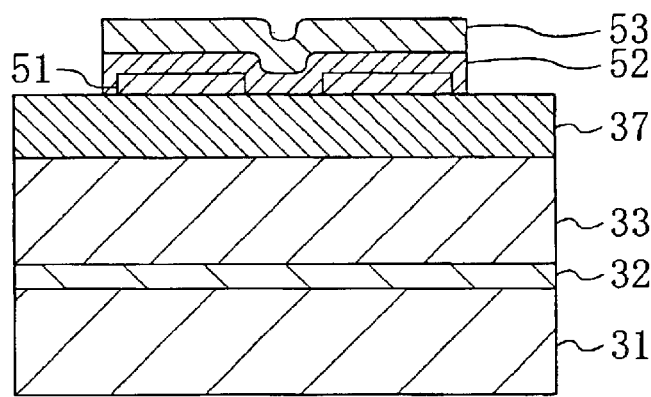

Subsequently, as shown in FIG. 4(b), with the second silicon film 53 serving as a mask, part of the silicon compound film 52 exposed through the opening of the second silicon film 53 is selectively removed using a buffer etchant of hydrofluoric acid and ammonium fluoride.

Figure 4C:
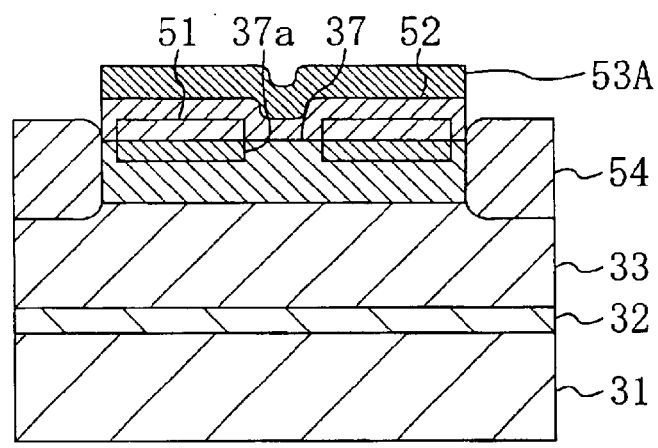

Next, as shown in FIG. 4(c), the semiconductor multilayer structure is introduced in an oxidizing atmosphere at a temperature of about 1000° C., and then subjected to a heat treatment for about 1 through 2 hours. As a result, the surface of the second silicon film 53 is oxidized to a silicon oxide film 53A. In this process step, part of the semiconductor multilayer structure which is not covered by the second silicon film 53 undergoes oxidation from its surface side, thereby forming an isolating insulator film 54 out of the oxides of the Group III–V nitride semiconductors. In the other part thereof covered by the second silicon film 53, silicon diffuses from the first silicon film 51 to selectively form silicon-containing AlGaN layers 37a in the upper portion of the AlGaN layer 37.

Figure 4D:
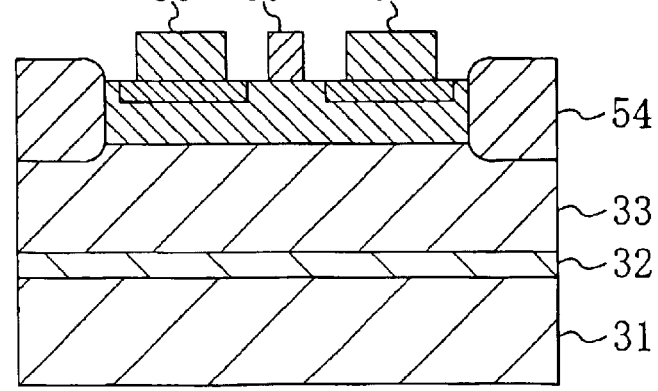

Next, as shown in FIG. 4(d), the silicon oxide film 53A formed through the heat treatment, the silicon compound film 52 and the first silicon film 51 are sequentially removed by wet etching. Thereafter, a gate electrode 55 is formed in an area of the active region in which no silicon-containing AlGaN layers 37a have been formed, while source and drain electrodes 56 and 57 are formed in the areas of the active region in which the silicon-containing AlGaN layers 37a have been formed.

The semiconductor device formed in the above manner, if formed as a HFET with a gate length of 1 μm, has substantially the same maximum drain current value, maximum mutual conductance value and contact resistance value as those of the semiconductor device of the first embodiment, thereby achieving good electric characteristics.

In the semiconductor device fabrication method of the second embodiment, silicon is not diffused in the gate-electrode formation region by the heat treatment, which ensures that the Schottky barrier has a certain height, while allowing the contact resistance to decrease. More specifically, in the semiconductor device of the second embodiment, the height of the Schottky barrier is about 1 eV, which is increased by about 0.2 eV from that of the first embodiment.

As described above, in the second embodiment, the first silicon layer 51 functions as a silicon-supplying layer from which silicon is selectively diffused into the active region except for the gate-electrode formation region thereof, while the silicon compound film 52 and the second silicon film 53 function as oxidation protection films which protect the active region against oxidation. Further, the second silicon film 53 functions as a protection layer which prevents the oxygen gas that forms the oxidizing atmosphere from going through the silicon compound film 52 to oxidize the active region, in the case where the silicon compound film 52 is made of a deposited film of silicon oxide alone.

In the semiconductor device fabrication method of the second embodiment, although the multilayer film in which the silicon compound film 52 and the second silicon film 53 are stacked in this order is used as an oxidation protection film, the present invention is not limited to this structure, but a single-layer film of silicon oxide or silicon nitride may be used as an oxidation protection film. In addition, instead of the second silicon film 53, a silicon nitride film with a thickness of about 100 nm or other semiconductor layers through which oxygen gas does not pass easily, may be used.

Furthermore, in the second embodiment, the uppermost layer of the semiconductor multilayer structure is also not limited to the AlGaN layer 37, but a cap layer of GaN may be formed on the AlGaN layer 37. Then, the effect of reducing the source resistance by using the cap layer, for example, is attained. In this case, it is also possible to suppress the silicon diffusion from the oxidation protection film 38 in the surface portion of the AlGaN layer 37, which therefore prevents the silicon diffusion from proceeding to such an extent as to degrade the electric characteristics of the semiconductor device.

What is claimed is:

1. A method for fabricating a semiconductor device, comprising:
    the step of forming on a first semiconductor layer of aluminum gallium nitride a protection film having an opening and containing silicon, and
    the step of heat-treating the first semiconductor layer in an oxidizing atmosphere whose temperature is adjusted to be within a range of 950° C. or more and 1050° C. or less.

2. The semiconductor device fabrication method of claim 1, wherein the heat-treatment step further includes the step of oxidizing part of the first semiconductor layer which is located under the opening of the protection film, and the step of diffusing the silicon downwardly from the protection film.

3. The semiconductor device fabrication method of claim 1, further comprising the step of forming on the first semiconductor layer a second semiconductor layer which is mainly made of gallium nitride, before the protection-film formation step is performed.

4. The semiconductor device fabrication method of claim 1, wherein the protection-film formation step further includes the step of forming on the first semiconductor layer a silicon-supplying layer which contains silicon, and the step of forming an oxidation protection layer on the silicon-supplying layer.

5. The semiconductor device fabrication method of claim 4, wherein in the silicon-supplying-layer formation step, the silicon-supplying layer is formed on a part of an active region of the first semiconductor layer other than a part of the active region on which a gate will be formed, and
    in the oxidation-protection-layer formation step, the oxidation protection layer is formed over the active region of the first semiconductor layer so as to cover the silicon-supplying layer.

6. The semiconductor device fabrication method of claim 4, wherein the oxidation protection layer is made of silicon oxide or silicon nitride.

7. The semiconductor device fabrication method of claim 4, wherein the oxidation protection layer is a multilayer film in which a silicon oxide film, and a silicon film or a silicon nitride film are stacked in this order.

* * * * *